United States Patent
Barraud

(10) Patent No.: US 10,522,669 B2
(45) Date of Patent: Dec. 31, 2019

(54) QUANTUM BOX DEVICE COMPRISING DOPANTS LOCATED IN A THIN SEMICONDUCTOR LAYER

(71) Applicant: COMMISSARIAT A L'ENERGIE ATOMIQUE ET AUX ENERGIES ALTERNATIVES, Paris (FR)

(72) Inventor: Sylvain Barraud, Le Grand Lemps (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/724,862

(22) Filed: Oct. 4, 2017

(65) Prior Publication Data
US 2018/0097095 A1    Apr. 5, 2018

(30) Foreign Application Priority Data
Oct. 5, 2016 (FR) ....................... 16 59621

(51) Int. Cl.
*H01L 29/76* (2006.01)
*H01L 27/118* (2006.01)
(Continued)

(52) U.S. Cl.
CPC .......... *H01L 29/7613* (2013.01); *B82Y 10/00* (2013.01); *H01L 27/11807* (2013.01);
(Continued)

(58) Field of Classification Search
CPC ........... H01L 29/7613; H01L 29/66469; H01L 29/167; H01L 27/11807; H01L 29/66227;
(Continued)

(56) References Cited

U.S. PATENT DOCUMENTS 5,665,979 A    9/1997  Takahashi et al.
5,701,017 A    12/1997 Patel et al.
(Continued)

FOREIGN PATENT DOCUMENTS

EP    2 075 745 A1    7/2009
WO   WO 02/50886 A1   6/2002

OTHER PUBLICATIONS

French Preliminary Search Report dated Jun. 28, 2017 in French Application 16 59621, filed on Oct. 5, 2016 (with English Translation of Categories of cited documents).
(Continued)

*Primary Examiner* — Tucker J Wright
*Assistant Examiner* — Dmitriy Yemelyanov
(74) *Attorney, Agent, or Firm* — Oblon, McClelland, Maier & Neustadt, L.L.P.

(57) ABSTRACT

A method of making a quantum device with a quantum island structure is provided. The method includes the formation of a stack including a first semiconducting layer based on an undoped semiconducting material on which at least one second doped semiconducting layer is grown by epitaxy, the doping being made during epitaxial growth, a first region belonging to the first semiconducting layer and a second region belonging to the second semiconducting layer being suitable for forming a quantum island.

13 Claims, 9 Drawing Sheets

(51) Int. Cl.
    *H01L 29/12*    (2006.01)
    *H01L 29/66*    (2006.01)
    *B82Y 10/00*    (2011.01)
    *H01L 29/08*    (2006.01)
    *H01L 29/167*   (2006.01)
    H01L 21/768     (2006.01)
    H01L 29/786     (2006.01)

(52) U.S. Cl.
    CPC ........ *H01L 29/0895* (2013.01); *H01L 29/127* (2013.01); *H01L 29/167* (2013.01); *H01L 29/66227* (2013.01); *H01L 29/66469* (2013.01); H01L 21/768 (2013.01); H01L 29/786 (2013.01); H01L 29/78621 (2013.01); H01L 2027/11885 (2013.01)

(58) Field of Classification Search
    CPC . H01L 29/0895; H01L 29/127; H01L 21/768; H01L 29/78621; H01L 29/786; H01L 2027/11885; B82Y 10/00
    See application file for complete search history.

(56) References Cited

U.S. PATENT DOCUMENTS

| | | | |
|---|---|---|---|
| 6,091,076 A * | 7/2000 | Deleonibus | B82Y 10/00 257/24 |
| 6,441,392 B1 | 8/2002 | Gautier et al. | |
| 6,566,680 B1 * | 5/2003 | Krivokapic | H01L 29/0895 257/30 |
| 2002/0024089 A1 | 2/2002 | Yano et al. | |
| 2004/0075123 A1 | 4/2004 | Fraboulet et al. | |
| 2004/0238812 A1 * | 12/2004 | Wasshuber | B82Y 10/00 257/14 |
| 2016/0268406 A1 | 9/2016 | Barraud et al. | |
| 2017/0317200 A1 * | 11/2017 | Cheng | H01L 29/7613 |

OTHER PUBLICATIONS

J. R. Petta, et al. "Coherent Manipulation of Coupled Electron Spins in Semiconductor Quantum Dots", Science, vol. 309, 2005, 6 pages.

R. Hanson, et al. "Spins in few-electron quantum dots", Rev. Mod. Phys., vol. 79, 2007, 52 pages.

M. Veldhorst, et al. "An addressable quantum dot qubit with fault-tolerant control-fidelity", Nature Nanotechnology, vol. 9 2014, 5 pages.

Juha T. Muhonen, et al. "Storing quantum information for 30 seconds in a nanoelectronic device", Nature Nanotechnology, vol. 9, 2014, 6 pages.

Lars R. Schreiber, et al. "Silicon comes back", Nature Nanotechnology, 2014, 2 pages.

D. N. Jamieson, et al. "Controlled shallow single-ion implantation in silicon using an active substrate for sub-20-keV ions", Applied Phys. Letters, vol. 86, 2005, 4 pages.

S. Barraud, et al. "Performance of Omega-Shaped-Gate Silicon Nanowire MOSFET With Diameter Down to 8nm", IEEE Electron Device Letters, vol. 33, No. 11, 2012, 3 pages.

* cited by examiner

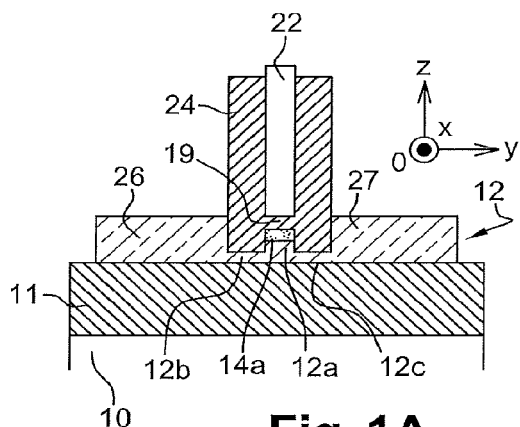
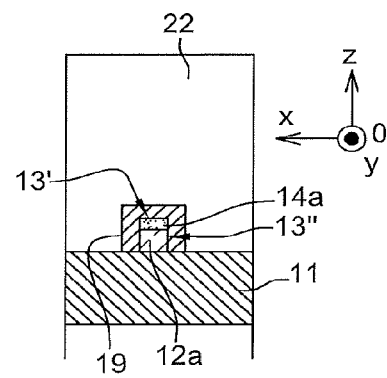
Fig. 1A     Fig. 1B
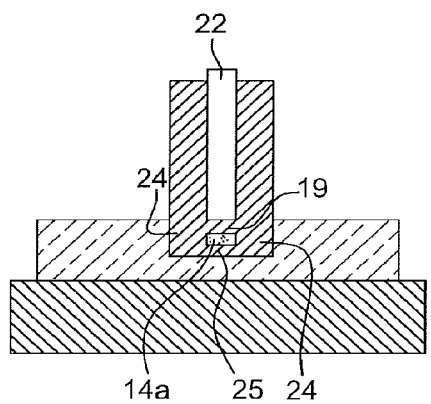
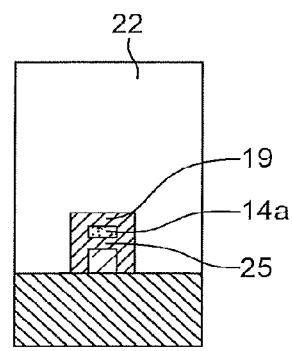
Fig. 2A     Fig. 2B

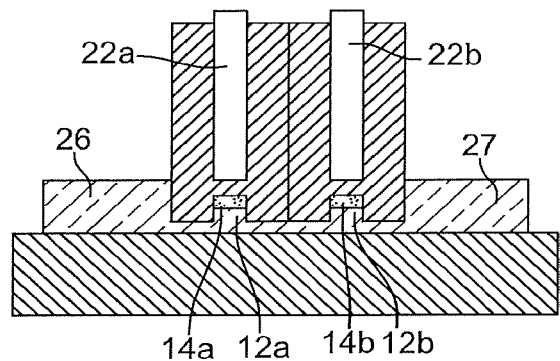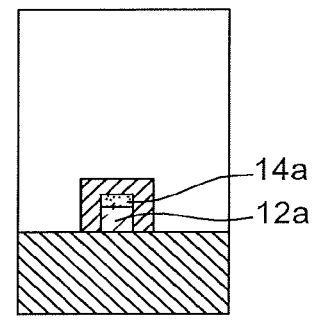
Fig. 3A	Fig. 3B
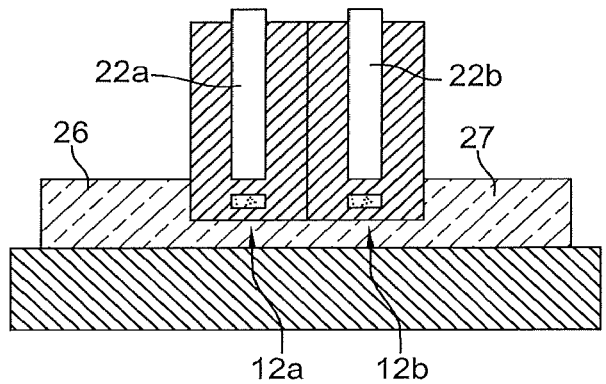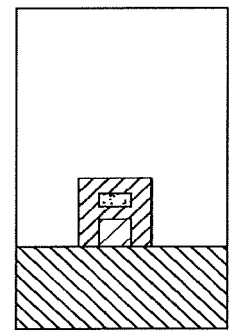
Fig. 4A	Fig. 4B

QUANTUM BOX DEVICE COMPRISING DOPANTS LOCATED IN A THIN SEMICONDUCTOR LAYER

TECHNICAL DOMAIN AND PRIOR ART

This application relates to quantum devices with one or several quantum islands and particularly to quantum devices making use of the Coulomb blocking phenomenon.

Quantum islands, also called "quantum boxes" or "quantum dots" are semiconducting structures made on the submicronic scale in which free electrons are present. In these structures, free electrons are confined in the form of a gas of electrons.

Quantum islands or boxes are coupled through tunnel barriers to regions forming electron reservoirs and commonly called source and drain regions.

The principle of electron transport in these structures is based essentially on Coulomb blocking. An electron cannot be added into a quantum box with another electron unless it has enough energy to overcome Coulomb repulsion between two electrons.

It is known how to fabricate quantum islands (boxes) from a hetero-structure formed from a stack of two III-V type semiconducting materials, namely GaAs and AlGaAs. In such a structure, the free electrons are strongly confined at the interface between GaAs and AlGaAs, thus forming a gas of electrons capable of moving in 2 dimensions Confinement in the other two dimensions is then obtained by depleting the electron gas using biased metallic electrodes.

Such a type of structure is described for example in the document by Hanson et al. "Spins in few-electron quantum dots", Rev. Mod. Phys. 79, 1217, October 2007.

Other quantum box structures are described in the Quantum computation document: "Silicon comes back", Schreiber et al., Nature Nanotechnology Volume: 9, Pages: 966-968, 2014. Some trap electrons in an Si/SiGe heterostructure while others confine electrons at the interface between a layer of semiconducting material and an $Al_2O_3$ oxide.

According to another approach, a structure provided with quantum islands is used in which the electron spin is related to a phosphorus dopant present in a semiconducting material, particularly purified $Si_{28}$. Thus, the use of such a structure creates a problem because the number of dopants must be small (ideally only one dopant) and their positions must be very well controlled.

The document "Controlled shallow single-ion implantation in silicon using an active substrate for sub-20-keV ions", by Jamieson et al. Appl. Phys. Lett. 86, 202101 (2005) discloses the use of a quantum device with a quantum island structure made of silicon doped with phosphorus. The dopants are generated by ion implantation. With such a method, there is a risk of the dopants being badly or imprecisely located.

The question arises of making use of a new quantum device that is better with regard to the above-mentioned disadvantages.

PRESENTATION OF THE INVENTION

On purpose of this invention is to fabricate a quantum device provided with at least one quantum island structure comprising a doped region in which the dopants are very precisely located.

Thus, one embodiment of this invention relates to a method of making a quantum device comprising the formation of a stack comprising a first semiconducting layer based on an undoped semiconducting material on which at least one second doped semiconducting layer is grown by epitaxy, the doping being made during epitaxial growth, a first region belonging to the first semiconducting layer and a second region belonging to the second semiconducting layer being suitable for forming a quantum island.

By making the doped region by concomitant growth and doping, a precise location of the dopant(s) is obtained and an interface between the doped region and the undoped region of the quantum island can be precisely defined. Furthermore, such doping by epitaxy enables the creation of a very thin doped semiconducting region, preferably of the order of several nanometres thick, typically between 2 nm and 5 nm.

The semiconducting region is advantageously encapsulated on each side by spacers positioned on the flanks of an electrostatic control gate.

The position and the geometry of quantum islands of the device are perfectly controlled and defined by the dimension of the gate.

After formation of the doped region, at least one electrostatic control gate of the quantum island can be made on said stack, the gate being arranged facing the first region and the second region.

The formation of said stack can include the growth of a third semiconducting layer based on undoped semiconducting material on the second semiconducting layer.

With such a layer, there is no need to add dopants from the second doped semiconducting layer directly in contact with the gate dielectric (or oxide).

According to a first possible embodiment of the method, the following steps are performed after the gate has been formed:

thin portions of said stack located on each side of said regions and the gate, thinning being done so as to expose the lateral edges of said second region, a thickness $e'_1$ of the first semiconducting layer being conserved, then formation of isolating spacers on each side of the gate, the spacers covering the lateral edges of said second region. Thus, thinned zones of the first semiconducting layer are made that will form tunnel junctions and spacers are formed to achieve lateral isolation of the doped region.

The formation of the stack can include growth of another layer on the first semiconducting layer based on undoped semiconducting material before epitaxial growth of the second semiconducting layer. This other layer may be semiconducting and may comprise a sacrificial zone. The method may then also include the following steps, after formation of the gate and before formation of the isolating spacers:

remove the sacrificial zone so as to form an empty space between said first region and said second region, then fill in said empty space by a dielectric material. This empty space can advantageously be filled in during the formation of spacers by the dielectric material from which the spacers are formed. The result is thus isolation all around the doped region, preventing both vertical and horizontal diffusion of dopants.

After the formation of spacers, the source and drain semiconducting regions can be grown on thinned zones of the stack.

According to one possible embodiment, the method includes formation of the stack, and etching of the stack so as to form a semiconducting block before formation of the gate. This semiconducting block can be in the form of a nanowire.

According to a second possible embodiment of the invention, the following steps can be performed before formation of the stack:

formation of a sacrificial gate block on the first semiconducting layer, formation of a mask around the sacrificial gate block, then removal of the sacrificial gate block to form a cavity, the cavity exposing the first region of the first semiconducting layer, epitaxial growth of the second semiconducting layer taking place in the cavity, the electrostatic control gate then being made in the cavity on the second semiconducting layer.

The first semiconducting layer can be a surface layer of a semiconductor on insulator type substrate, the surface layer resting on an insulating layer of the substrate.

Advantageously, the second semiconducting layer with dopants is positioned between the gate dielectric and the insulating layer of the substrate, for example in buried oxide form.

The method according to the invention is compatible with co-integration of the quantum device with one or several transistors using the CMOS technology, in particularly for which the dimensions of the thickness of the semiconducting material of the channel and the grid length are small.

According to another aspect, this application relates to a semiconducting device with quantum effect, including:

at least one quantum island structure formed from a first semiconducting region, and a second semiconducting region, the first semiconducting region being undoped while the second semiconducting region is doped and is located facing said first semiconducting region, an electrostatic control gate located facing the first semiconducting region and the second semiconducting region.

The device may be provided with isolating spacers located on each side of the gate, that extend to come into contact with the lateral edges of said second region.

The first region forms part of a first semiconducting layer on which the spacers are located, the first layer comprising a first tunnel junction under a first spacer among said spacers and a second tunnel junction under a second spacer among said spacers, the device also comprising a source semiconducting region and a drain semiconducting region on opposite sides of the gate, and spacers.

According to one possible embodiment of the quantum device, the first semiconducting region and the second semiconducting region are located one on top of the other, a region of dielectric material being intercalated between the first semiconducting region and the second semiconducting region.

According to one possible embodiment of the quantum device, the first region forms part of a first semiconducting layer, at least one other quantum island structure being formed from another undoped semiconducting region of the first semiconducting layer and another doped semiconducting region located on the other undoped semiconducting region, the device comprising another electrostatic control gate located facing said other semiconducting regions.

The first region may belong to a surface semiconducting layer of a semiconductor on insulator type substrate comprising an insulating layer on and in contact with which the surface layer is located and a semiconducting support layer on and in contact with which the insulating layer is located, the insulating layer being provided with a material and thickness so as to enable electrostatic coupling between the quantum island and the semiconducting support layer.

According to another aspect, this application relates to a semiconducting device with quantum effect, including:

at least one quantum island structure comprising a doped semiconducting region, an electrostatic control gate of the quantum island formed on the doped semiconducting region, isolating spacers located on each side of the electrostatic control gate, a source semiconducting region and a drain semiconducting region on each side of the gate, and isolating spacers, a first tunnel barrier under one isolating spacer and a second tunnel barrier under another isolating spacer, in which the isolating spacers extend in contact with lateral edges of said doped semiconducting region, the doped semiconducting region being located on and in contact with an undoped semiconducting region or a region of dielectric material.

BRIEF DESCRIPTION OF THE DRAWINGS

This invention will be better understood after reading the description of example embodiments given purely for information and that are in no way limitative, with reference to the appended drawings on which:

FIGS. 1A-1B illustrate a first example of a quantum device as implemented according to one embodiment of this invention, the device being provided with at least one quantum island structure formed in a semiconducting structure provided with a doped region formed by epitaxy on an undoped region;

FIGS. 2A-2B illustrate a variant embodiment of the quantum device for which the doped region and the undoped region are separated by an insulating region;

FIGS. 3A-3B illustrate another variant embodiment of the quantum device with several quantum islands between a source region and a drain region, the electrostatic control of the islands being provided by several gate electrodes;

FIGS. 4A-4B illustrate another example embodiment of the quantum device with several doped regions entirely surrounded by dielectric material;

Figure 5A:
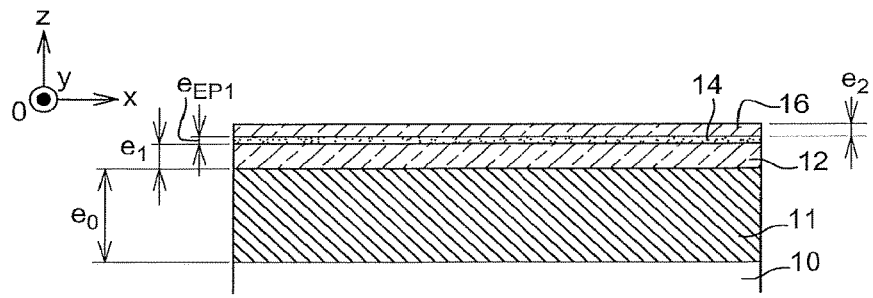
FIGS. 5A-5F illustrate a first example embodiment of a quantum device in which a quantum island structure is created by forming a doped semiconducting region by epitaxial growth with concomitant doping.

Furthermore, in the following description, terms that depend on the orientation of the device such as "upper", "lower" and "lateral" should be understood assuming that the structure is oriented as shown on the figures.

Identical, similar or equivalent parts of the different figures have the same numeric references to facilitate the comparison between the different figures.

The different parts shown on the figures are not necessarily all at the same scale, to make the figures more easily understandable.

DETAILED PRESENTATION OF PARTICULAR EMBODIMENTS

We will now refer to FIGS. 1A-1B illustrating a quantum effect device as implemented according to one embodiment of this invention.

This device, based on the Coulomb blocking principle, comprises a semiconducting structure called a quantum island or quantum box, and that is isolated from the remainder of the device by two tunnel junctions. The electrostatic energy necessary for an electron from a first so-called "source" electrode or region 26 to transit on the quantum island by the tunnel effect and reach a second so-called "drain" electrode or region 27 depends on how a third so-called "gate" electrode 22 is biased.

The device is made on a semiconducting substrate such as a semiconductor on insulator type substrate provided with a semiconducting surface layer 12, for example made of silicon, itself lying on a BOX ("Buried OXide") insulating layer 11. In this example, the island structure comprises a region 12a called the "channel" region of the surface semiconducting layer 12. The channel region 12a extends between a first semiconducting region 26 forming the source region and a second semiconducting region 27 forming the drain region In this example, the channel region 12a is undoped and is covered by and is in contact with a doped semiconducting region 14a, particularly N-doped, the doping species typically being phosphorus. In this island structure, the electron spin of which the state can be modified is related to the phosphorus dopant present in the doped semiconducting region 14a.

The doped semiconducting region 14a is a layer formed by epitaxy so as to define a low and precisely controlled doping level. In this device, the interface between the doped zone and undoped zone is defined precisely at the contact zone between the semiconducting regions 12a and 14a, which enables precise positioning of the free electron(s) generated by doping.

The stacked undoped semiconducting region 12a and N-doped semiconducting region 14a form a semiconducting block typically parallelepiped in shape with a height and thickness between several nanometres and several tens of nanometres and a width for example between 5 nm and 10 nm The gate 22 is located on this semiconducting block 12a-14a and is separated from it by a gate dielectric 19. The gate 22 is thus coupled to the quantum island through a capacitance. Better electrostatic control of the quantum island can be achieved by partially encasing the gate 22, extending as illustrated on FIG. 1B, around several faces of the semiconducting block and particularly facing the top face 13' and the lateral faces 13" of the semiconducting block 12a-14a.

Isolating spacers 24 are provided in contact with the lateral faces of the gate 22 to isolate the quantum island from the source and drain regions 26, 27. The isolating spacers 24 extend in contact with the lateral faces of the semiconducting block 14a-12a and in particular cover the lateral edges of the doped semiconducting region 14a. The term "lateral" edges refers to edges that extend between an upper face and a lower face of the doped semiconducting region 14a. The upper face is the face facing the gate while the lower face is the face facing the surface layer of the substrate.

In this example embodiment, the isolating spacers 24 also extend partially facing the lateral edges of the undoped semiconducting region 12a.

The junctions or tunnel barriers are made in regions 12b and 12c of the semiconducting layer 12 located on each side of the channel region 12a and located under the spacers 24. These regions 12b, 12c are thin, and in particular are thinner than the channel region 12a. The thickness of the regions 12b, 12c is preferably less than 5 nm.

One variant embodiment includes a thin insulating layer 11, for example less than 25 nm thick to enable coupling between the channel semiconducting region 12 and the support layer of the substrate. Thus, the surface layer 12 can be biased through its back face, in other words the face opposite the face on which the gate is supported.

FIGS. 2A-2B show another variant embodiment of the device, including a doped semiconducting region 14a, in this case located on an insulating region 25. The doped semiconducting region is thus confined between the isolating spacers 24 located on each side of this region 14a, the gate dielectric 19 covering this region 14a and the insulating region 25 on which this region 14a is located.

Thus, the insulating region 25 is intercalated between the doped semiconducting region 14a and the undoped semiconducting region 12a. The thickness and the material used for the insulating region 25 are chosen such that electrostatic coupling can be set up between the doped semiconducting region 14a and the undoped semiconducting region 12a. This insulating region 25 is based on a dielectric material, for example such as silicon oxide or nitride and its thickness can for example be between 2 nm and 10 nm. Thus, the insulating region 25 is located in contact with the lower face of the doped semiconducting region 14a and the upper face of the undoped semiconducting region 12a.

For this variant, the doped semiconducting region 14a is completely surrounded by dielectric material so as obtain better control over the electrons and to prevent diffusion of dopants. In this example embodiment, the quantum island is formed by the doped region 14a. The quantum island thus extends entirely under the gate. The tunnel barriers remain located under the spacers 24.

As a variant to either of the examples described, an undoped semiconducting region 16a can be located on the doped region 14a and thus placed between this doped region 14a and the gate stack. Such a configuration is illustrated for example on FIG. 5F.

The examples of a quantum effect device that have just been given include an electrostatic control grid for a quantum island. As a variant and as illustrated in the example embodiment in FIGS. 3A-3B or in FIGS. 4A-4B, a device can be implemented in which several quantum islands 1a, 1b are arranged in series, and each island 1a (or 1b) can be controlled through a gate electrode 22a (or 22b).

In the example embodiment in FIGS. 3A-3B, a first block composed of a doped semiconducting region 14a located on and in contact with an undoped semiconducting region 12a is connected through a semiconducting portion of the surface layer 12 to a second block formed from a doped semiconducting region 14b located on and in contact with an undoped semiconducting region 12b.

In the example embodiment in FIGS. 4A-4B, a first quantum island 1a with an arrangement of the type described previously with reference to FIGS. 2A-2B is arranged in series with a second quantum island 1b with the same type of an arrangement.

A device with quantum islands or boxes as described above can form a quantum bit (Qbit) and for example can be integrated into a logic circuit adapted to use quantum information processing or a spintronic circuit, or even a circuit used in a quantum computer. Such a circuit can be associated with or can comprise several transistors, particularly transistors made using CMOS technology and more particularly transistors made on a thin film using an FDSOI technology. A device with quantum islands or boxes as described above can be adapted particularly for co-integration with a transistor structure with channel structure formed by one or several nanowires and partially encasing gate commonly called "Tri-Gate" or "Omega-Gate", in other words that extends on the different faces of the nanowire to facilitate control of the channel.

An example method of making a quantum device will now be described with reference to FIGS. 5A-5F.

The initial material for this method in this case is a semiconductor on insulator type substrate comprising a semiconducting support layer 10, for example made of silicon. The support layer 10 is coated with an insulating layer 11, itself coated with a so-called "surface" semiconducting layer 12. In particular, an SOI (silicon on insulator) type substrate is used in which the surface semiconducting layer 12 is based on silicon.

The thickness of the surface semiconducting layer 12 is equal to $e_1$ that may be between 7 nm and 15 nm, for example of the order of 10 nm. The insulating layer 11 commonly called BOX (Buried Oxide) is typically based on $SiO_2$ and its thickness $e_0$ can be between 25 nm and 145 nm, for example of the order of 145 nm (the thicknesses $e_1$ and $e_0$ being dimensions measured parallel to a z axis of an orthogonal coordinate system [O; x; y; z] shown on FIG. 5A). In the case in which the surface layer 12 is to be biased though its back face, in other words through the support layer 10, a thinner insulating layer 11 can be provided, with thickness $e_0$ that can be between 10 and 25 nm, for example of the order of 15 nm.

A doped semiconducting layer 14, for example based on Si doped with phosphorus so as to obtain Si:P, is formed on the surface layer 12. The doped semiconducting layer 14 is made by epitaxy with in situ doping, so that precise doping can be achieved and an interface between the undoped zone and the doped zone can be precisely localised. Such a method also makes it possible to use a thin doped layer, for example with a thickness less than 5 nm.

The thickness $e_{EPI}$ of the doped semiconducting layer 14 may for example be of the order of 5 nm.

Another undoped semiconducting layer 16 can be formed on the doped semiconducting layer 14. This undoped semiconducting layer 16 can isolate the doped layer from the gate dielectric layer. This other semiconducting layer 16 can be based on Si and its thickness can be $e_2$, for example of the order of 3 nm.

The next step (FIG. 5B), is to etch the semiconducting layers 12, 14, 16, so as to define one or several distinct oblong or elongated blocks 18.

In particular, the distinct blocks 18 can be parallelepiped shaped nanowires. Distinct blocks 18 can be provided with a width $W_{NW}$ or critical dimension for example between 5 nm and 20 nm (the width $W_{NW}$ being a dimension measured parallel to the principal plane of the substrate and particularly to the x axis of the [O; x; y] plane, the principal plane of the substrate being defined as a plane passing through the substrate and parallel to the [O; x; y] plane).

Figure 5B:
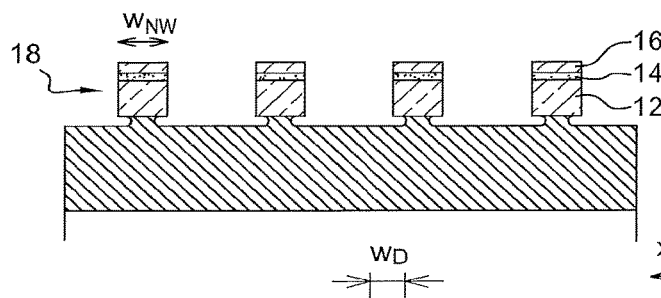
Figure 5C:
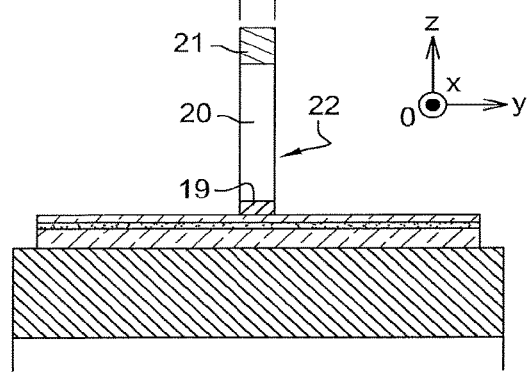

The next step is to form a gate 22 on the semiconducting blocks 18 (FIG. 5C giving a cross-sectional view on a cut plane orthogonal to the cut plane in FIG. 5B). The gate 22 can be partially encasing and extend on semiconducting blocks 18 and on the lateral faces of blocks 18. This gate 22 is typically made by formation of a gate stack and then by etching this stack, except for at least one block protected by a hard mask 21. The hard mask 21 can be formed from a layer of silicon oxide overlain by a layer of silicon nitride. The gate stack is formed from a dielectric layer 19 and a layer 20 made of conducting or semiconducting material. For example, the layer 19 can be based on a high-k dielectric material such as $HfO_2$ when the layer 20 is based on a metal such as tungsten or comprises a metal thickness. According to another example, the layer 19 may also be based on $SiO_2$ when the layer 20 is made of a semiconducting material such as polysilicon. The gate is designed to have a preferably small critical dimension called the width $W_D$, specifically between 10 nm and 30 nm, for example of the order of 7 nm. Throughout this description, the critical dimension refers to a dimension of a pattern other than its thickness. A small gate width $W_D$ can give a high island charge energy.

Preferably, the doped thickness $T_{dop}$ of the semiconducting layer 14 (in which $T_{dop}$ can be equal to $e_{EPI}$ when the layer 14 is fully doped) doped with phosphorus (Si:P) is fixed as a function of the dimensions $W_{NW}$ and $W_D$ so as to have one or two dopants in a volume V, such that $V=W_{NW}*W_D*T_{dop}$.

The following table contains different examples of doping levels ($m^{-3}$) as a function of the dimensions of the doped region 12a and the number of dopants to be obtained close to the island.

| no. of dopants | $W_{NW}$ (nm) 5 | $W_D$ (nm) 5 | $T_{dop}$ (nm) 2 | Box volume ($nm^3$) 50 |
|---|---|---|---|---|
| 1 | 2.00E+25 | | | |
| 2 | 4.00E+25 | | | |
| 3 | 6.00E+25 | | | |
| 4 | 8.00E+25 | | | |
| | Si:P channel doping | | | |

| no. of dopants | $W_{NW}$ (nm) 7 | $W_D$ (nm) 7 | $T_{dop}$ (nm) 2 | Box volume ($nm^3$) 98 |
|---|---|---|---|---|
| 1 | 1.02E+25 | | | |
| 2 | 2.04E+25 | | | |
| 3 | 3.06E+25 | | | |
| 4 | 4.08E+25 | | | |
| | Si:P channel doping | | | |

| no. of dopants | $W_{NW}$ (nm) 10 | $W_D$ (nm) 10 | $T_{dop}$ (nm) 2 | Box volume ($nm^3$) 200 |
|---|---|---|---|---|
| 1 | 5.00E+24 | | | |
| 2 | 1.00E+25 | | | |
| 3 | 1.50E+25 | | | |
| 4 | 2.00E+25 | | | |
| | Si:P channel doping | | | |

| no. of dopants | $W_{NW}$ (nm) 10 | $W_D$ (nm) 10 | $T_{dop}$ (nm) 3 | Box volume ($nm^3$) 300 |
|---|---|---|---|---|
| 1 | 3.33E+24 | | | |
| 2 | 6.67E+24 | | | |
| 3 | 1.00E+25 | | | |
| 4 | 1.33E+25 | | | |
| | Si:P channel doping | | | |

Figure 5D:
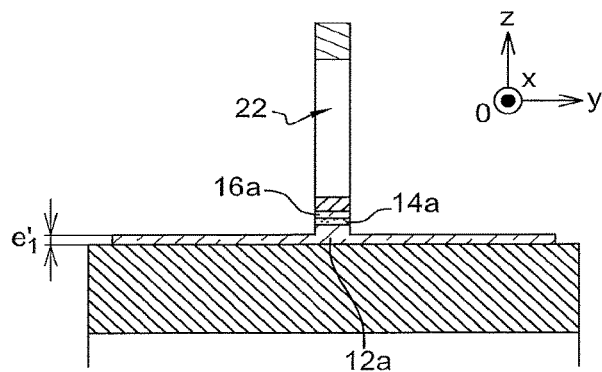

The next step is partial removal of portions of the semiconducting block(s) 18 that are not protected by the hard mask 21 and that are located on each side of the gate—22 (FIG. 5D). This partial etching is done so as to remove portions of the semiconducting layer 16, the doped semiconducting layer 14 that are not protected by the hard mask 21, until reaching the surface semiconducting layer 12. Etching is preferably prolonged so as to also remove a thickness not protected by the hard mask 21 of the surface semiconducting layer 12. It can thin some portions of semiconducting blocks 18 and thus expose the lateral edges of an etched region 16a derived from the undoped semiconducting layer 16a and an etched region 14a derived from the doped semiconducting layer 14a. Prolonging etching as far as a level located underneath the lower face of the doped region 14a exposes lateral zones of a region 12a of the undoped surface semiconducting layer 12a facing the gate. This subsequently makes it possible to encapsulate the entire surface of the lateral edges of the doped region 14a.

After etching, a thickness $e'_1$ of the surface layer 12 is kept on each side of the gate 22 so that epitaxy can be resumed. However, this remaining thickness $e'_1$ is small so that tunnel junctions can be made. Preferably, the remaining thickness $e'_1$ is less than 5 nm and may for example be of the order of 3 to 5 nm. For example, portions of the stack of semiconducting layers 12, 14, 16 can be etched by plasma etching.

Figure 5E:
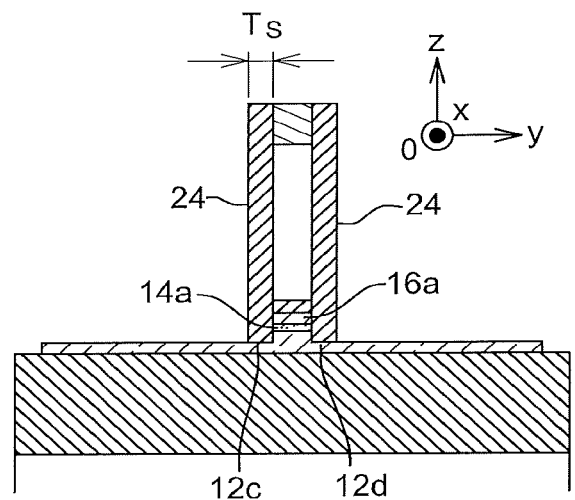

Once the surface semiconducting layer 12 has been overetched, spacers 24 are formed in contact with the lateral flanks of the gate 22 (FIG. 5E). Spacers 24 are based on a dielectric material, for example such as silicon nitride or silicon oxide or SiBCN, and cover the lateral edges of the undoped region 16a and the doped region 14a and part of the region 12a. The spacers 24 can be formed with a thickness Ts for example between 10 nm and 50 nm, for example of the order of 15 nm. The thickness Ts (dimension measured parallel to the [O; x; y] plane) of the spacers 24 is chosen such that electrons present in the quantum island are not screened by the source and drain regions that will be formed later. Thinned regions 12c, 12d of the surface semiconducting layer 12 located under the spacers 24 are intended to form a first tunnel junction and a second tunnel junction respectively.

Figure 5F:
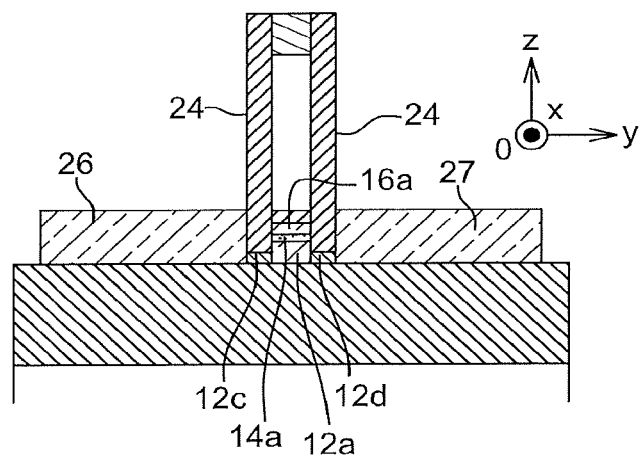

The next step is to form semiconducting regions 26, 27 that will form a first electron reservoir also called the source region and a second electron reservoir also called the drain region. The second semiconducting regions 26, 27 are made by epitaxial growth on the remaining parts of the surface semiconducting layer 12 located on each side of the gate 22 and the spacers 24 (FIG. 5F).

In the example embodiment described above, a quantum island is formed in a semiconducting structure comprising a doped semiconducting region 14a intercalated between an undoped semiconducting region 12a on which a lower face of the doped semiconducting region 14a rests and another undoped semiconducting region 16a resting on an upper face of the doped semiconducting region 14a opposite said upper face. The doped semiconducting region 14a is partially encapsulated by a dielectric material. In this example, this doped region 14a confined between two undoped regions 12a, 16a is only covered with dielectric material of the spacers 24 at its lateral edges. Lateral diffusion of the dopants is prevented.

Another example of a method in which the doped semiconducting region 14a of the quantum island is fully encapsulated will now be described with reference to FIGS. 6A-6G.

The starting point in this example embodiment is a semiconductor on insulator substrate like that described above, and a layer 13, at least one region of which will form a sacrificial zone, is formed on the surface semiconducting layer 12. The layer 13 is based on a material that can be selectively etched with regard to the material of the surface semiconducting layer 12 and that is preferably semiconducting. The layer 13 may for example by made of silicon germanium, particularly when the surface semiconducting layer 12 is made of silicon. The layer 13 can have a thickness $e_3$ for example between 3 nm and 10 nm, for example of the order of 3 nm.

Figure 6A:
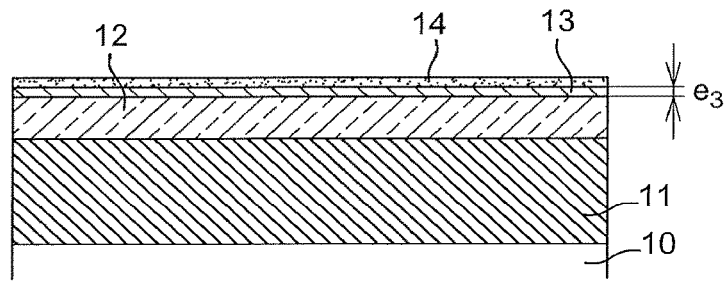
FIGS. 6A-6G illustrate a variant embodiment in which the doped semiconducting region is formed by growth on a sacrificial semiconducting region.

The doped semiconducting layer 14 is then formed by epitaxy on the layer 13, one zone of which can form a sacrificial zone (FIG. 6A).

Figure 6B:
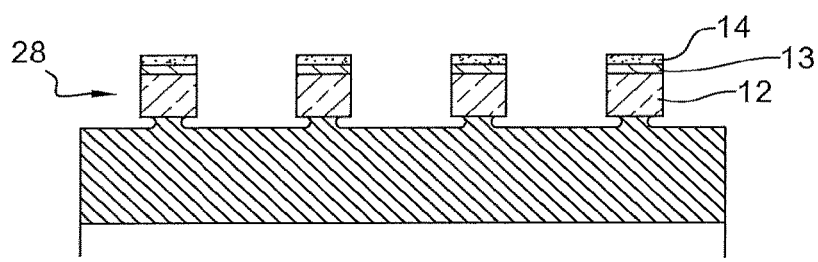

Nano-wires 28 are then etched in the stack of layers 12, 13, 14 (FIG. 6B).

Figure 6C:
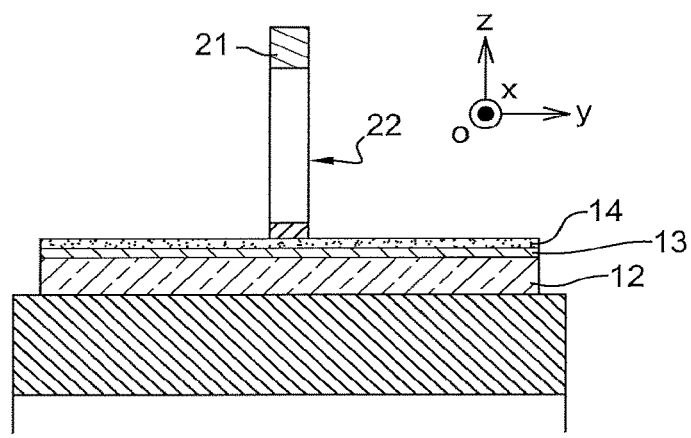

A gate 22 is then made extending orthogonal to the direction along which the nanowires 28 extend. The gate 22 is typically partially encasing around the nanowires 28 and is made by etching, using a hard mask 21 as an etching mask (FIG. 6C).

Figure 6D:
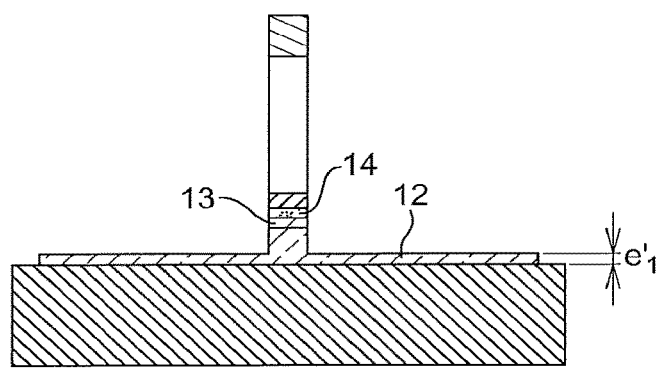

The next step is to remove portions of the stack of semiconducting layers 12, 13, 14 that are not facing the hard mask 21 and are thus located on each side of the gate 22. The removal is made so as to keep a thickness $e'_1$ of the surface layer 12 (FIG. 6D).

Figure 6E:
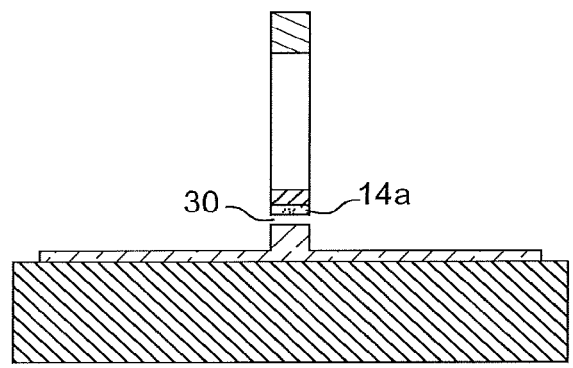

The next step is to selectively remove the sacrificial semiconducting layer 13. When this sacrificial layer 13 is made of SiGe, the removal can be made for example by wet etching, for example of the acetic acid type. Removal of the semiconducting layer 13 under the doped semiconducting layer 14 can form an empty space 30. Forming this empty space 30 thus exposes the lower face of the doped semiconducting region 14a (FIG. 6E).

Figure 6F:
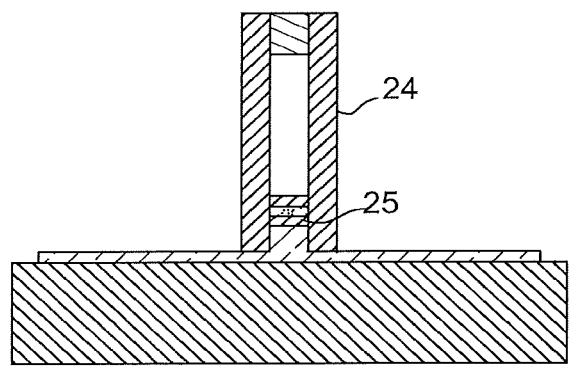

This empty space 30 is then filled in by a dielectric material 25, so as to form a zone of dielectric material in contact with the lower face of the doped semiconducting region 14a. Advantageously, this step is done during the formation of spacers 24 on each side of the gate 22 (FIG. 6F). The dielectric material of the spacers 24 then covers the lateral flanks of the gate, the lateral edges of the doped region 14a and the undoped region 12a and fills in the empty space 30 under the doped semiconducting region 14a. In this example, the doped semiconducting region 14a is entirely encapsulated by a dielectric material. Lateral and vertical diffusion of the dopants are thus prevented.

Figure 6G:
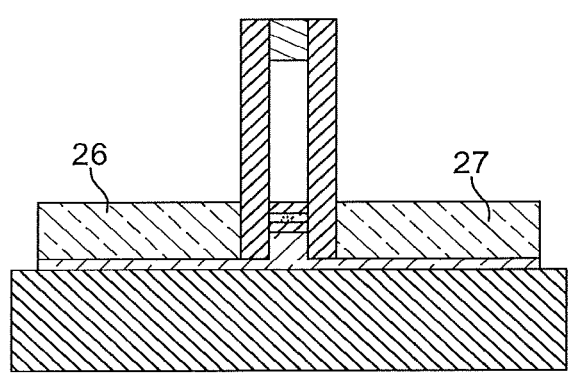

The next step is to grow the semiconducting regions 26, 27 on the remaining portions of the surface semiconducting layer 12 (FIG. 6G).

In the examples of the method described above, the gate electrode is made before the source and drain regions forming electron reservoirs.

A variant embodiment is shown on FIGS. 7A-7H.

Figure 7A:
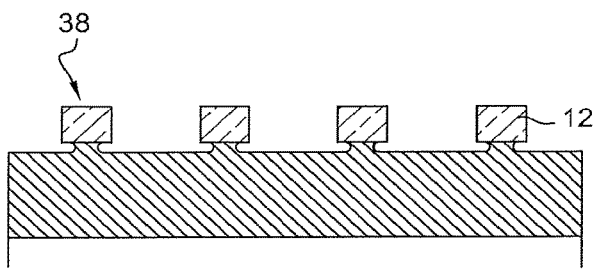
FIGS. 7A-7K illustrate an example embodiment of a quantum device including the formation of a doped region and an electrostatic control gate in a cavity.

The starting point for this example embodiment can be the same semiconductor on insulator substrate as that described above, and distinct blocks 38 are formed by etching the surface semiconducting layer 12 (FIG. 7A). Before the semiconducting blocks 38 are defined, the surface semiconducting layer 12 can be thinned so as to keep a thickness for example of the order of 4-5 nm.

Figure 7B:
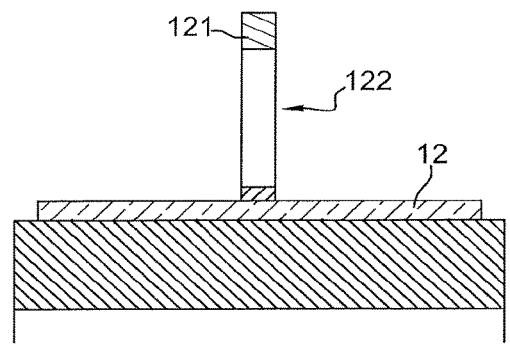

The next step is to make a sacrificial gate 122 on the blocks 38 (FIG. 7B).

The sacrificial gate 122 is made by etching a gate stack making use of a hard mask 121 as the etching mask. For example, the gate stack is formed from a layer of polysilicon on a silicon oxide layer.

Figure 7C:
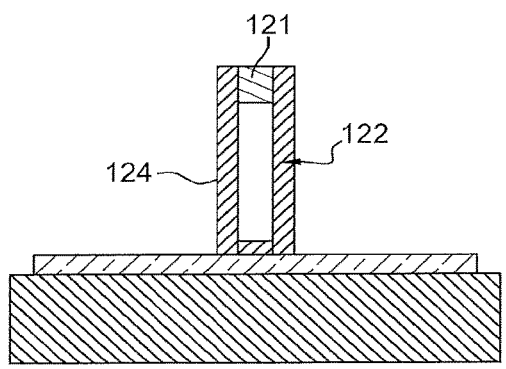

The next step is to form spacers 124 on each side of the sacrificial gate and the hard mask 121 (FIG. 7C).

Figure 7D:
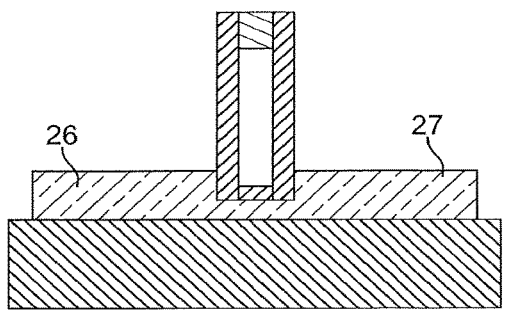

The source and drain semiconducting regions 26, 27 are then grown by epitaxy on portions of the surface semiconducting layer 12 that are not protected by the hard mask 121 (FIG. 7D).

Figure 7E:
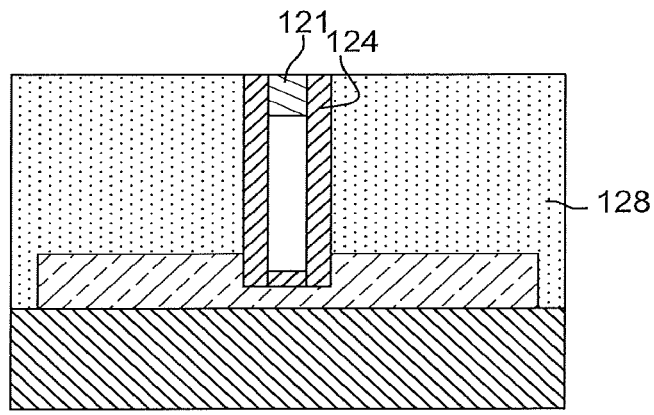

The next step is to form a layer made of a dielectric material 128, for example a PMD (pre-metal dielectric) layer made of $SiO_2$ on the source and drain regions 26, 27 and on the sacrificial gate. A CMP (Chemical Mechanical Planarisation) polishing is then done to bring the upper face of the layer of dielectric material 128 to the same level as the top of the hard mask 121. The layer of dielectric material 128 makes it possible to form a protection mask, using the spacers 124. The hard mask 121 is exposed and is surrounded by this protection mask (FIG. 7E).

Figure 7F:
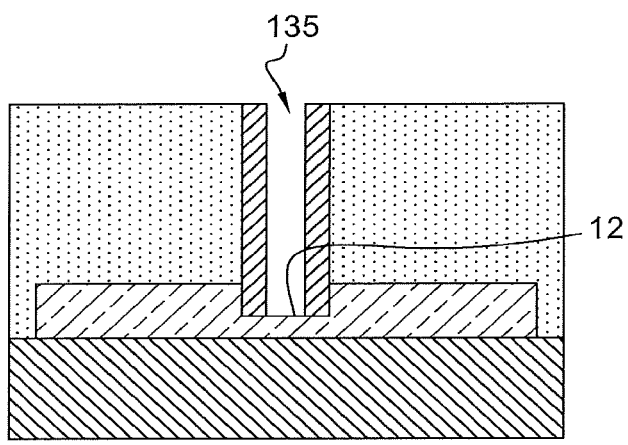

The hard mask 121 and the sacrificial gate 122 between the isolating spacers 124 are then removed. This step leads to the formation of a cavity 135 between the spacers 124 (FIG. 7F). The sacrificial gate 122 can be removed for example by selective etching using an $NH_4OH$ technique to eliminate the polysilicon and HF to remove the silicon dioxide. As a variant, the etching could for example be done using TMAH.

Once the sacrificial gate 122 has been removed, a region of the surface semiconducting layer 12 is exposed at the bottom of the cavity 135. A doped semiconducting region 214a is formed in this cavity 135 by epitaxial growth with in situ doping on the exposed region of the surface semiconducting layer. In other words, the semiconducting region 215a is grown as it is being doped.

Figure 7G:
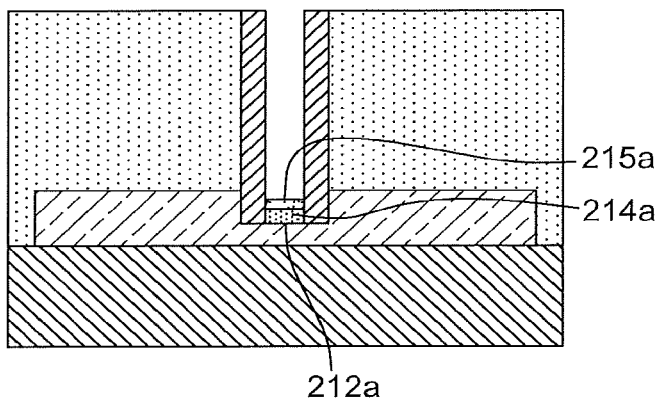

This growth can be preceded by epitaxial growth of an undoped semiconducting layer 212a to increase the thickness of undoped semiconducting material in a zone located between the spacers 124 (FIG. 7G).

Figure 7H:
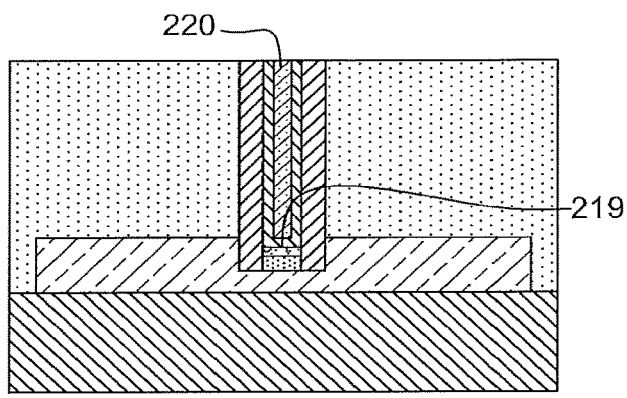

A gate dielectric layer 219 and a layer of gate material 220 are then formed on the doped semiconducting region 214a (FIG. 7H). For example, the dielectric layer 219 is made of $SiO_2$ while the material 220 is made of polysilicon. According to another example, the dielectric layer 219 is made of $HfO_2$ while the material 220 is made of W.

Figure 7I:
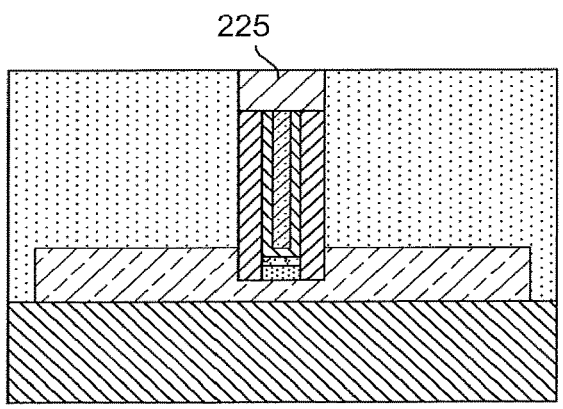

The gate material 220 can then be partially removed to define a position. This position is then filled in by a given material that can be dielectric and for example can be based on silicon nitride so as to form a protective plug 225 (FIG. 7I).

The next step is to selectively remove the layer of dielectric material 128. For example, when the protective plug 225 and the spacers 124 are made of silicon nitride and the layer of dielectric material 128 is made of silicon oxide, the selective removal is made by plasma etching.

Figure 7J:
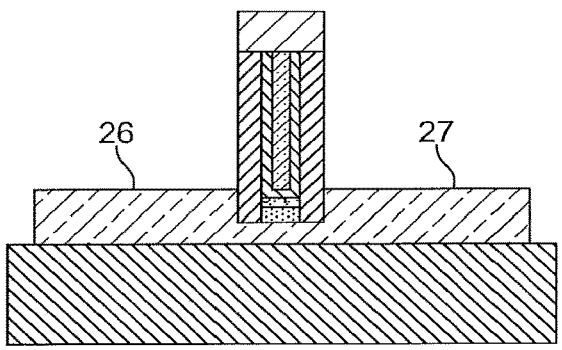

The source and drain semiconducting regions 26, 27 are then exposed again (FIG. 7J).

Figure 7K:
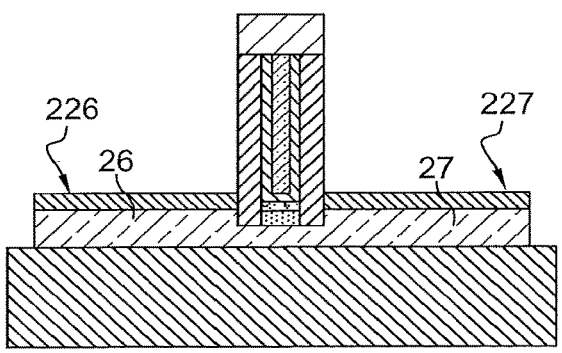

Metal alloy and semiconducting regions 226, 227 can then be formed on the semiconducting regions 26, 27. If the semiconducting regions 26, 27 are made of silicon, this step is done by silicidation by depositing a metal layer, for example made of nickel, and then by thermal annealing (FIG. 7K).

Each of the example methods that have just been described has the advantage that it enables co-integration of the quantum device with one or several transistors that may have a plane channel structure or a channel structure formed from one or several nanowires. The method according to the invention is thus particularly applicable to CMOS technologies making transistors using a method of the type commonly referred to as "gate-first" or "gate-last".

Some steps of the method for making the quantum device can thus be made at the same time as the transistors are made.

In particular, the transistor gate can be made at the same time as the gate of the quantum device. Transistor spacers can also be formed at the same time as the spacers of the quantum device. Source and drain regions of the transistor can also be made at the same time as the source and drain regions of the quantum device. Similarly, if the transistor is designed to have a channel structure in the form of one or several nanowires, this or these nanowires are made at the same time as the nanowire(s) that will form the quantum island structure.

The method according to the invention can also be adapted to co-integration with transistors made on a thin semiconducting film, for example using an FDSOI type technology.

The invention claimed is:

1. A quantum effect semiconducting device comprising:
   at least one quantum island structure comprising a doped semiconducting region;
   an electrostatic control gate formed on the doped semiconducting region;
   first and second isolating spacers located on each side of the electrostatic control gate;
   a source semiconducting region and a drain semiconducting region on each side of the electrostatic control gate and the first and second isolating spacers; and
   a first tunnel barrier under the first isolating spacer and a second tunnel barrier under the second isolating spacer,
   wherein the first and second isolating spacers extend in contact with lateral edges of the doped semiconducting region, the doped semiconducting region being located on and in contact with an undoped semiconducting region or a region of dielectric material, and
   wherein the first tunnel barrier and the second tunnel barrier are configured to allow passage of charge carriers by tunnel effect between the source semiconducting and drain semiconducting regions and the quantum island.

2. The quantum effect semiconducting device according to claim 1, also comprising a second quantum island structure and a second electrostatic control gate of the second quantum island structure, between the source semiconducting region and the drain semiconducting region.

3. The quantum effect semiconducting device according to claim 1, wherein the doped semiconducting region rests on a second undoped semiconducting region of a surface semiconducting layer of a semiconductor on insulator type substrate comprising an insulating layer on and in contact with the surface semiconducting layer and a semiconducting support layer on and in contact with the insulating layer, the insulating layer being provided with a material and thickness so as to be configured to enable electrostatic coupling between the quantum island structure and the semiconducting support layer.

4. The quantum effect semiconducting device according to claim 1, wherein the doped semiconducting region is located on and in contact with the undoped semiconducting region and wherein a second undoped semiconducting region is located on and in contact with the doped semiconducting region.

5. The quantum effect semiconducting device according to claim 1, wherein the doped semiconducting region is located on and in contact with the region of dielectric material, and wherein a second undoped semiconducting region is located on and in contact with the doped semiconducting region.

6. A method of making a quantum device according to claim 1, wherein the doped semiconducting region is located on the undoped semiconducting region, the doped semiconducting region and the undoped semiconducting region being made by forming a stack comprising a first semiconducting layer on undoped semiconducting material, growing by expitaxy at least one second doped semiconducting layer on the undoped semiconducting material, doping the second doped semiconducting layer by the epitaxial growth.

7. The method according to claim 6, wherein the formation of the stack includes growing a third semiconducting layer on the undoped semiconducting material on the second doped semiconducting layer.

8. The method according to claim 6, further comprising:
forming the electrostatic control gate of the quantum island structure, on the stack and facing the undoped semiconducting region and the doped semiconducting region,
thinning portions of the stack located on each side of the doped and undoped semiconducting regions and the electrostatic control gate, exposing the lateral edges of the doped semiconducting region by the thinning while conserving a thickness of the first semiconducting layer, and
forming the first and second isolating spacers on each side of the electrostatic control gate, the first and second isolating spacers covering the lateral edges of the doped semiconducting region.

9. The method according to claim 6, wherein the formation of the stack comprises growing a third semiconducting layer on the first semiconducting layer prior to epitaxial growth of the doped second semiconducting layer, a region of the third semiconducting layer being capable of forming a sacrificial zone, the method further including the following steps after the formation of the electrostatic control gate and prior the forming of the first and second isolating spacers:
forming an empty space between a first region and a second region by removing the sacrificial zone, then during the formation of the first and second isolating spacers:
filling in the empty space with a dielectric.

10. The method according to claim 8, further comprising growing the source and drain semiconducting regions on the thinned portions of the stack, after the formation of the first and second isolating spacers.

11. The method according to claim 6, further comprising forming a semiconducting block by etching of the stack, after the formation of the stack and prior to the forming of the electrostatic control gate.

12. The method according to claim 8, wherein the method further comprises, prior to the forming of the stack:
forming a sacrificial gate block on the first semiconducting layer,
forming a mask around the sacrificial gate block, and
forming a cavity by removing the sacrificial gate block, the cavity exposing a first region of the first semiconducting layer,
wherein the epitaxial growth of the second doped semiconducting layer takes place in the cavity, and the forming of the electrostatic control gate is made in the cavity.

13. The method according to claim 6, wherein the first semiconducting layer is a surface layer made of a semiconductor on insulator type substrate, the surface layer resting on an insulating layer of the substrate.

* * * * *